United States Patent [19]
Suzuki

[11] Patent Number: 6,157,571
[45] Date of Patent: Dec. 5, 2000

[54] SEMICONDUCTOR MEMORY DEVICE AND METHOD OF CONTROLLING A THRESHOLD VOLTAGE OF THE SAME

[75] Inventor: Koji Suzuki, Miyazaki pref., Japan

[73] Assignee: Oki Electric Industry Co., Ltd., Tokyo, Japan

[21] Appl. No.: 09/379,801

[22] Filed: Aug. 24, 1999

[30] Foreign Application Priority Data

Aug. 26, 1998 [JP] Japan .................................. 10-240464

[51] Int. Cl.$^7$ .................................................. G11C 16/10
[52] U.S. Cl. .................................. 365/185.2; 365/185.21; 365/185.22
[58] Field of Search ........................... 365/185.24, 185.2, 365/185.21, 185.22

[56] References Cited

U.S. PATENT DOCUMENTS

| | | | |
|---|---|---|---|
| 4,964,079 | 10/1990 | Devin | 365/168 |
| 5,838,612 | 11/1998 | Calligaro et al. | 365/185.03 |
| 5,978,261 | 11/1999 | Tailliet | 365/185.01 |

*Primary Examiner*—Andrew Q. Tran
*Attorney, Agent, or Firm*—Junichi Mimura

[57] ABSTRACT

A semiconductor memory device includes a reference current generating circuit that generates a reference current corresponding to a threshold voltage of a memory cell. A current comparing circuit compares a current across the memory cell when data is written to the memory cell, with the reference current. A control circuit controls the writing operation in response to a result of the comparison.

16 Claims, 5 Drawing Sheets

SEMICONDUCTOR MEMORY DEVICE AND METHOD OF CONTROLLING A THRESHOLD VOLTAGE OF THE SAME

CROSS-REFERENCE TO RELATED APPLICATION

This application claims the priority benefit of Japanese Patent Application No. 10-240464, filed Aug. 26, 1998, the entire subject matter of which is incorporated herein of reference.

BACKGROUND OF THE INVENTION

1. Field of the Invention

The invention relates to a nonvolatile semiconductor memory device, and to a method for controlling a threshold voltage thereof to read and/or write data therefrom.

2. Description of the Related Art

Generally, an EEPROM having a floating gate is well known as the nonvolatile memory from and to which data can be electrically read and written. The EEPROM includes a silicon substrate, a source and a drain in which impurities are diffused, a channel area, a gate oxide layer formed on the channel area, and a control gate. The floating gate is formed on the gate oxide layer, and the control gate is formed on the floating gate.

In the EEPROM, information is stored by injecting and storing electrons at the floating gate. A uniform condition, such as a writing voltage or a writing time, is applied to all memory cells to where date is written to memory cells in the EEPROM. Therefore, if every memory cell does not have the same characteristics, the memory cells do not have a uniform a threshold voltage. Here, the voltage of the control gate at the time that the channel between the source and the drain is formed is defined as the threshold voltage.

SUMMARY OF THE INVENTION

The purpose of the invention to provide a semiconductor memory device and a method of controlling a threshold voltage of the same which can reduce the variation in the threshold voltage among the memory cells.

To achieve the above-mentioned purpose, the semiconductor memory device of the mention has a reference current generating circuit that generates a reference current corresponding to a threshold voltage of a memory cell, a current comparison circuit that compares the reference current with a current across the memory cell when data is written to the memory cell, and a control circuit that controls the writing operation in response to a result of the comparison.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
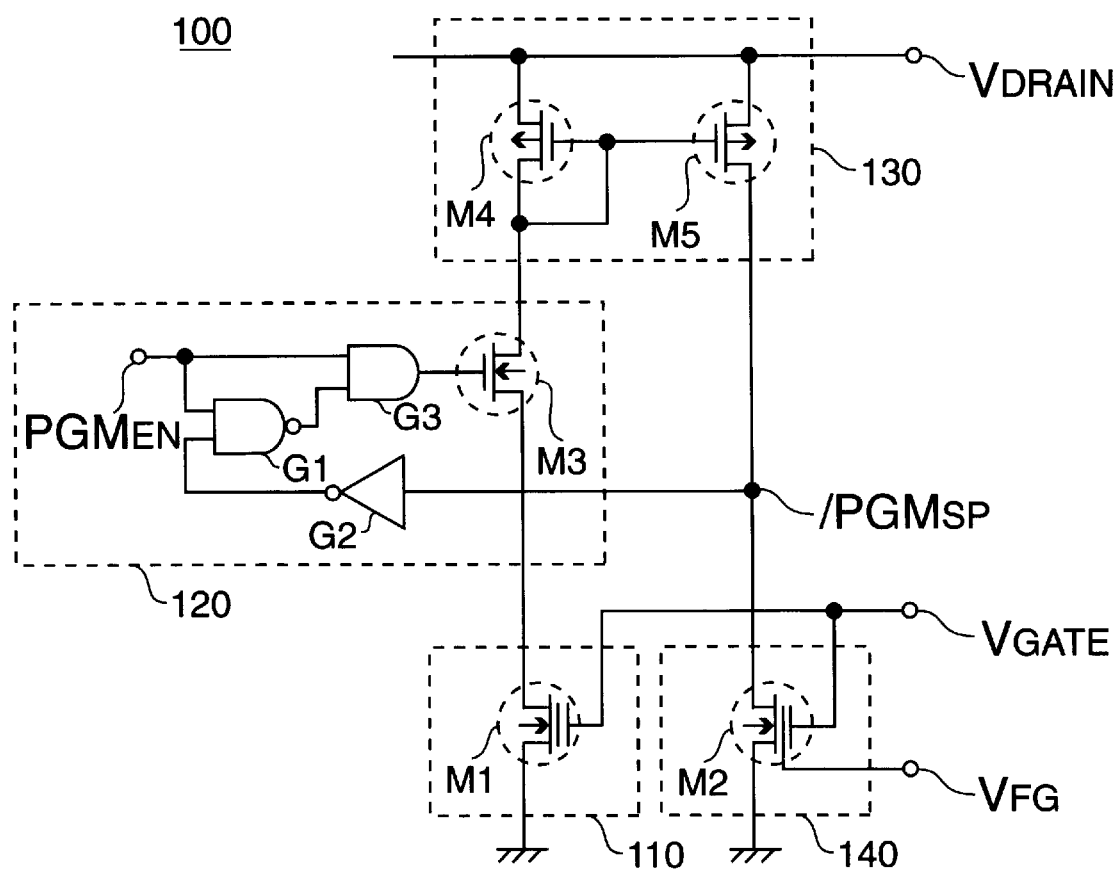
FIG. 1 is a circuit diagram of a semiconductor memory device according to a first embodiment of the invention.

Referring FIG. 1, a semiconductor memory device 100 includes a memory cell 110, a control circuit 120 for controlling a writing operation of the memory cell 110, a current mirror circuit 130, and a reference memory cell 140 for generating a reference current. The semiconductor device also has other unillustrated memory cells and unillustrated decoder circuits.

The memory cell 110 includes an NMOS transistor M1. The NMOS transistor M1 has a source electrode connected to ground, a control gate electrode connected to a terminal to which a gate voltage VGATE is applied, a drain electrode connected a source electrode of an NMOS transistor M3 in the control circuit 120, and a floating electrode.

The control circuit 120 has a two-input NAND gate G1, an inverter G2, a two-input AND gate G3, and the NMOS transistor M3. Two signals are input to the control circuit, including a write enable signal PGMEN and a write halting signal/PGMSP. One of the two input terminals of the NAND gate G1 and one of the two input terminals of the AND gate G3 receive the write enable signal PGMEN. The other input terminal of the NAND gate G1 receives the write halting signal/PGMSP through the inverter G2. The output terminal of the NAND gate G1 is connected to the other input terminal of the AND gate G3. The output terminal of the AND gate G3 is connected to the control gate electrode of the NMOS transistor M3. The drain electrode of the NMOS transistor M3 is connected to a drain electrode and a gate electrode of a PMOS transistor M4 in the current mirror circuit 130.

When the write enable signal PGMEN and the write halting signal/PGMSP are at a high level, the NMOS transistor M3 is turned on. Then, the data is written to the memory cell 110 while the NMOS transistor M3 is turned on. If the write halting signal/PGMSP is changed to a low level, the NMOS transistor M3 is turned off. That is, the data is not written to the memory cell 110 while the NMOS transistor M3 is turned off.

The current mirror circuit 130 has PMOS transistors M4, M5. Each source electrode of the PMOS transistors M4, M5 is connected to a terminal to which a drain voltage VDRAIN is applied. The drain electrode of the PMOS transistor M5 is connected to a drain electrode of a NMOS transistor M2 in the reference memory cell 140. The electric potential of the drain electrode of the PMOS transistor M5 is input to the control circuit 120 as the write halting signal/PGMSP.

The gate electrode of the PMOS transistor M4 is connected to its drain electrode and the gate electrode of the PMOS transistor M5. The drain electrode of the PMOS transistor M4 acts as a current input terminal to the memory cell 110 through the NMOS transistor M3 in the control circuit 120.

The reference memory cell 140 includes the NMOS transistor M2. The NMOS transistor M2 has a control gate electrode connected to the terminal to which the gate voltage VGATE is applied, a floating gate electrode connected to the terminal to which a floating gate voltage VFG is applied, a source electrode connected to ground, and a drain electrode connected the source electrode of the PMOS transistor M5 of the current mirror circuit 130.

Figure 2:
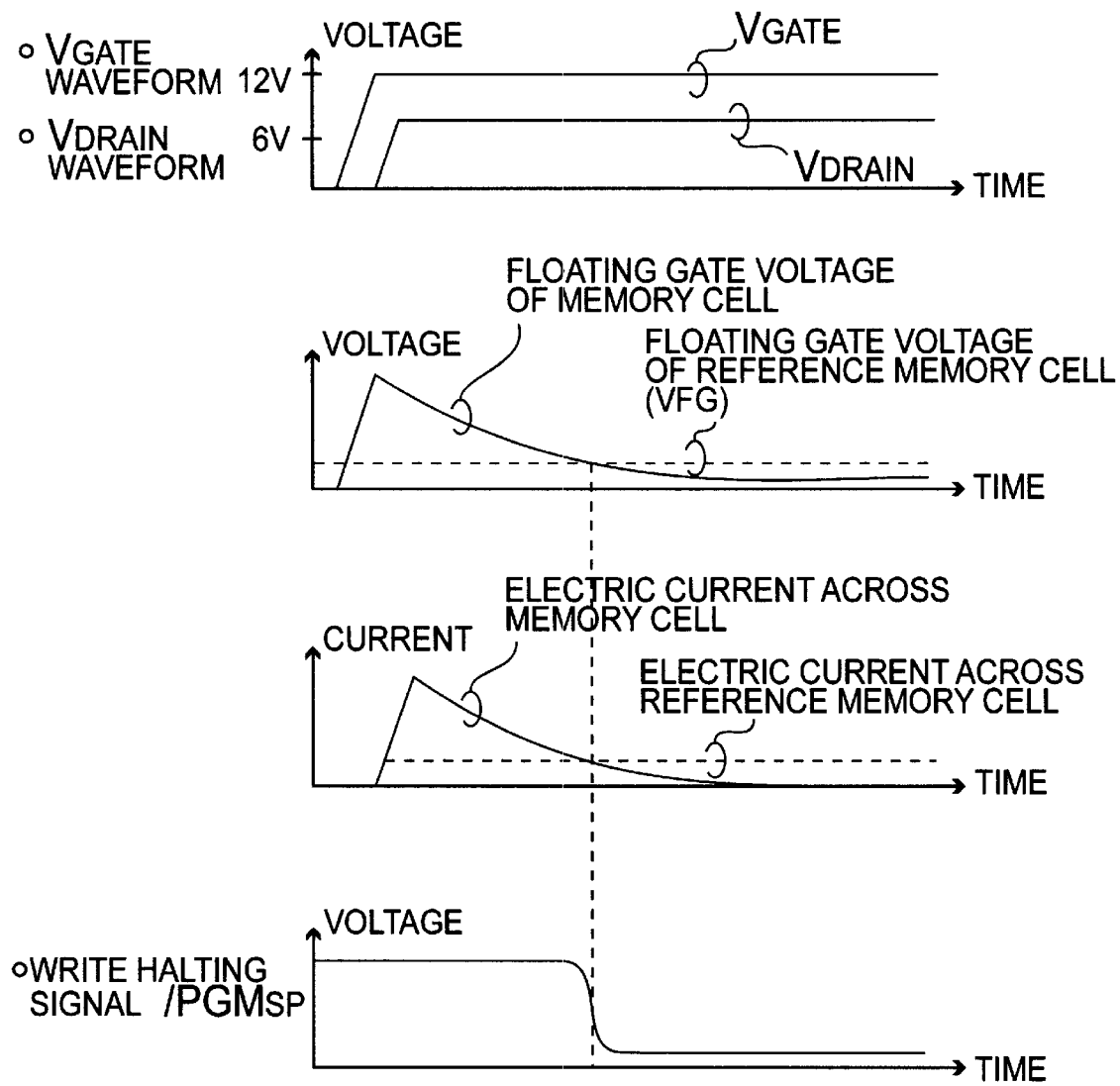
FIG. 2 is a waveform chart showing the data writing operation of the first embodiment.

The operation of the semiconductor memory device is explained below with reference to the operation waveform chart shown in FIG. 2.

In an initial status of the device, there is no charge stored at the floating gate of the NMOS transistor M1 in the memory cell 110. The write enable signal PGMEN is at a low level at this stage.

When data is written to the NMOS transistor M1 in the memory cell 110, the level of the write enable signal PGMEN is changed to high. The gate voltage VGATE is set at 12V, and the drain voltage is set at 7V. The floating gate voltage VFG is set at a predetermined voltage below 12V. The amount of current that flows through the NMOS transistor M2 of the reference memory cell 140 is determined by the floating gate voltage VFG.

If the write enable signal PGMEN is change to a high level, then the NMOS transistor M3 is turned on. In this situation, the PMOS transistors M3, M4 are set to provide a source/drain voltage across the NMOS transistor M1 that exceeds 6V. The current is supplied to the NMOS transistor M1 in the memory cell 110 through the PMOS transistors M3, M4.

By the operation of the current mirror circuit 130, the same current that is supplied to the NMOS transistor M1 is supplied to the PMOS transistor M5. During the initial period that the current is supplied to the NMOS transistor M1, the current across the NMOS transistor M1 is larger than the current across the NMOS transistor M2. That is, the write halting signal/PGMSP is change to a high level.

As time passes following initiation of the writing operation, the electric potential of the floating gate of the NMOS transistor M1 falls. Therefore, the amount of the current across the NMOS transistor M1 is also falls. This current continues to fall until it is smaller than the current across the NMOS transistor M2, at which time the write halting signal/PGMSP is changed to a low level signal. The output of the AND gate G3 therefore changes to a low level so that the NMOS transistor M3 is turned off. That is, the operation of data writing to the NMOS transistor M1 of the memory cell 110 is halted because the NMOS transistor M3 is turned off.

Namely, the current mirror circuit 130 is used as part of the circuit for comparing the current across the memory cell 110 to that across the reference memory cell 140. The amount of the current across the NMOS transistor M1 when the data writing operation is halted is equal to the amount of the current across the NMOS transistor M2. This shows that the voltage at the floating gate of the NMOS transistor M1 is substantially equal to the floating gate voltage VFG of the NMOS transistor M2. Therefore, the same voltage is applied to the floating gates of all memory cells, and the threshold voltage of the memory cells is uniform.

According to the first embodiment of the invention, as the current across the memory cell 110 during the writing operation is compared with the current across the reference memory cell 140, and then, the writing operation is halted in response to the result of the comparison, the variation of the threshold voltage of the memory cell can be reduced.

Figure 3:
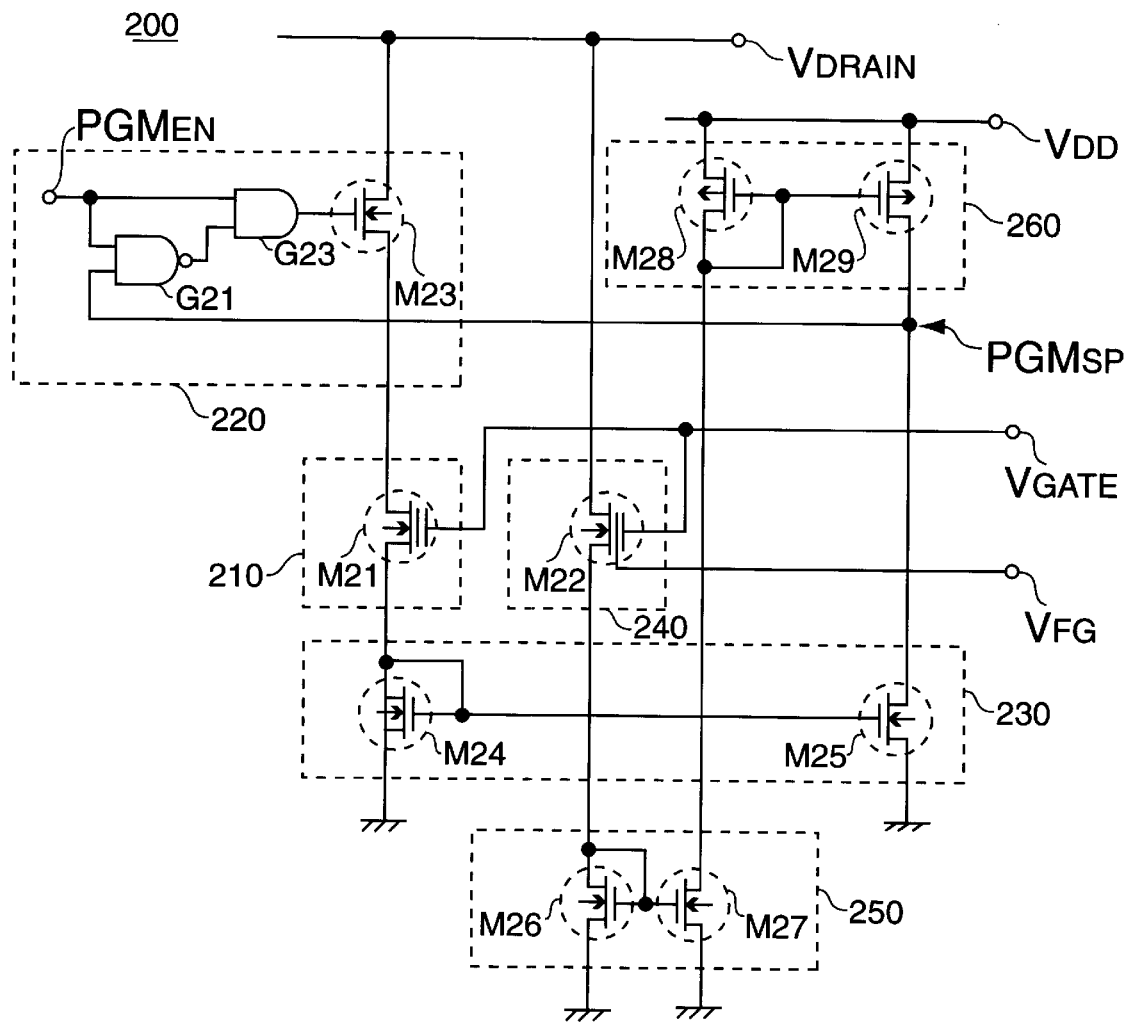
FIG. 3 is a circuit diagram of a semiconductor memory device according to a second embodiment of the invention.

Referring to the FIG. 3, a semiconductor memory device 200 of the second embodiment includes a memory cell 210, a control circuit 220 for controlling a writing operation of the memory cell 110, a first current mirror circuit 230, a second current mirror circuit 250, a third current mirror circuit 260, and a reference memory cell 240 for generating reference current.

The memory cell 210 has an NMOS transistor M21. The NMOS transistor M21 has a source electrode connected drain/gate electrodes of a NMOS transistor M24, a control gate electrode connected to a terminal to which a gate voltage VGATE is applied, a drain electrode connected to a source electrode of an NMOS transistor M23 in the control circuit 220, and a floating electrode.

The control circuit 220 has a two-input NAND gate G21, a two-input AND gate G23, and the NMOS transistor M23. Two signals are input to the control circuit, including a write enable signal PGMEN and a write halting signal PGMSP. One of the two input terminals of the NAND gate G21 and one of two input terminals of the AND gate G23 receive the write enable signal PGMEN. The other input terminal of the NAND gate G21 receives the write halting signal PGMSP. The output terminal of the NAND gate G21 is connected to other input of the AND gate G23. The output terminal of the AND gate G23 is connected to the control gate electrode of the NMOS transistor M23. The drain electrode of the NMOS transistor M23 is connected to a terminal to which a drain voltage VDRAIN is applied.

When the write enable signal PGMEN is at a high level and the write halting signal PGMSP is at a low level, the NMOS transistor M23 is turned on. Then, the data is written to the memory cell 110 while the NMOS transistor M23 is turned on. If the write halting signal PGMSP is changed from low to high, the NMOS transistor M23 is turned off. That is, the data is not written to the memory cell 210 while the NMOS transistor M23 is turned off.

The first current mirror circuit 230 includes NMOS transistors M24, M25. Each source electrode of the NMOS transistors M24, M25 is connected to ground. The drain electrode of the NMOS transistor M25 is connected to the drain electrode of a PMOS transistor M29 in the third current mirror circuit 260. The electric potential of the drain electrode of the PMOS transistor M25 is input to the control circuit 220 as the write halting signal PGMSP.

The gate electrode of the NMOS transistor M24 is connected to its drain electrode and a gate electrode of the NMOS transistor M25.

The second current mirror circuit 250 includes NMOS transistors M26, M27. The source electrodes of the NMOS transistor M26, M27 are connected to ground. The drain electrode of the PMOS transistor M27 is connected to the drain electrode of a PMOS transistor M28 in the third current mirror circuit 260. The gate electrode of the NMOS transistor M26 is connected to its drain electrode and the gate electrode of the NMOS transistor M27.

The third current mirror circuit 260 includes PMOS transistors M28, M29. The source electrodes of the PMOS transistor M28, M29 are connected to the power supply VDD. The drain electrode of the PMOS transistor M29 is connected to the drain electrode of the NMOS transistor M25. The gate electrode of the PMOS transistor M28 is connected to its drain electrode and the gate electrode of the PMOS transistor M29.

The reference memory cell 240 includes an NMOS transistor M22. The NMOS transistor M22 has a control gate electrode connected the terminal to which the gate voltage VGATE is applied, a floating gate electrode connected to the terminal to which a floating gate voltage VFG is applied, a source electrode connected the drain electrode of the NMOS transistor M26 in the second current mirror circuit 250, and a drain electrode connected to the terminal to which the drain voltage VDRAIN is applied.

Figure 4:
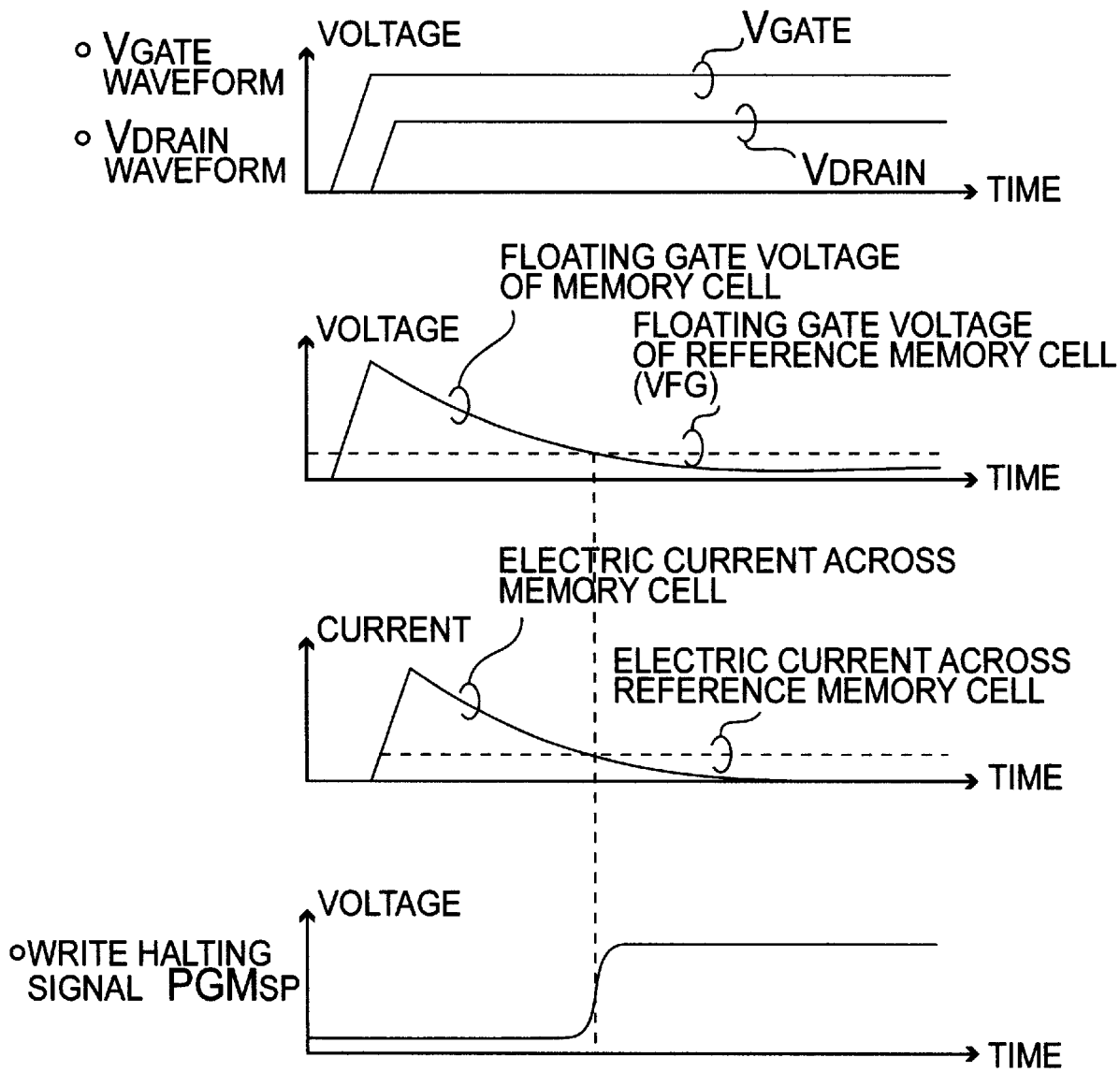
FIG. 4 is a waveform chart showing the data writing operation of the second embodiment.

The operation of the semiconductor memory device 200 is explained below with reference to the operation waveform chart shown in FIG. 4. The basic operation is quite similar to the above-described operation of the first embodiment and, differs therefrom only as follows.

Namely, as three current mirror circuits are used in the second embodiment, a current which is the same as the current across the NMOS transistor M21 is supplied to the PMOS transistor M29 through the current mirror circuits 230, 250, 260. Further, the write halting signal PGMSP is applied to the controls signal, which has an logic that is opposite to the logic used in the first embodiment.

According to the second embodiment of the invention, the drain electrodes of the NMOS transistors M21, M22 are not connected to the terminal to which the drain voltage VDRAN is applied, through any PMOS transistors. Therefore, in addition to the benefits of the first embodiment, the accuracy of current comparison is further improved comparing to the first embodiment.

Figure 5:
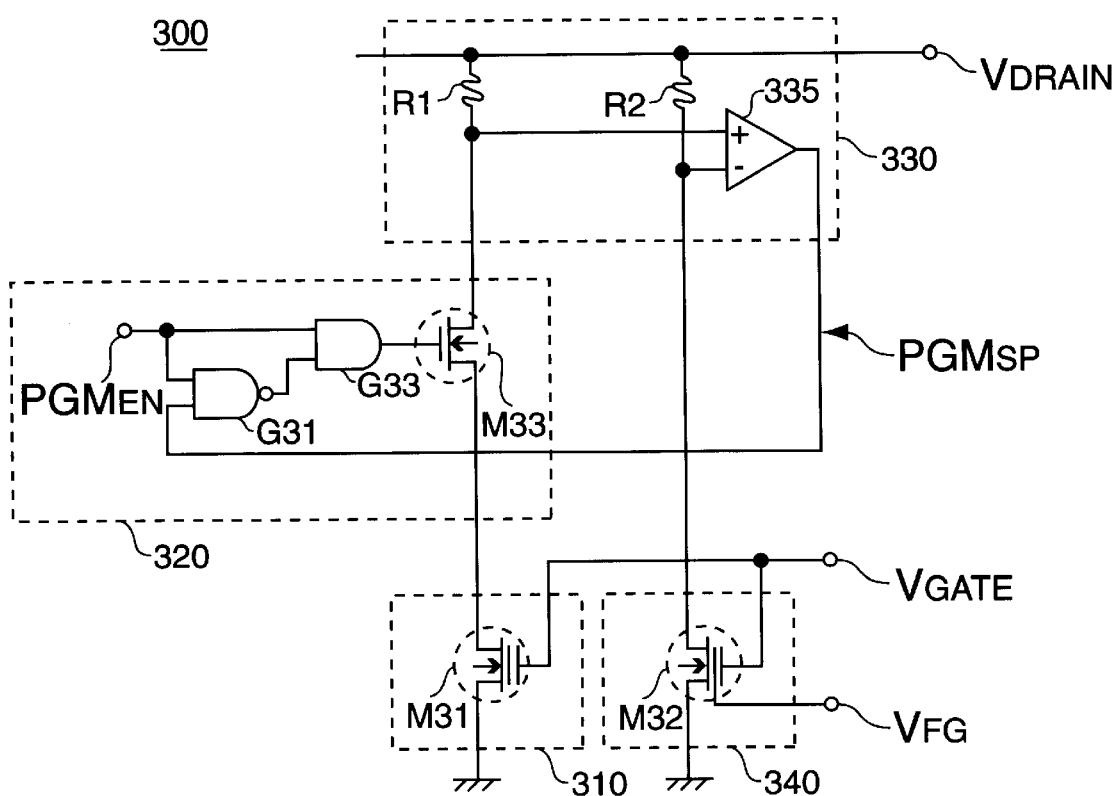
FIG. 5 is a circuit diagram of a semiconductor memory device according to a third embodiment of the invention.

Referring FIG. 5, a semiconductor memory device 300 according to a third embodiment of the invention includes a memory cell 310, a control circuit 320 for controlling a writing operation of the memory cell 310, an current comparison circuit 330, and a reference memory cell 340 for generating a reference current.

The memory cell 310 includes an NMOS transistor M31. The NMOS transistor M31 has a source electrode connected to ground, a control gate electrode connected to a terminal to which a gate voltage VGATE is applied, a drain electrode connected to a source electrode of an NMOS transistor M33 of the control circuit 320, and a floating electrode.

The control circuit 320 has a two-input NAND gate G31, a two-input AND gate G33, and the NMOS transistor M33. Two signals are input to the control circuit, including a write enable signal PGMEN and a write halting signal PGMSP. One of the two-input terminals of the NAND gate G31 and one of the two-input terminals of the AND gate G33 receive the write enable signal PGMEN. The other input of the NAND gate G31 receives the write halting signal PGMSP. The output terminal of the NAND gate G31 is connected to the other input terminal of the two-input AND gate G33. The output terminal of the AND gate G33 is connected to the control gate electrode of the NMOS transistor M33. The drain electrode of the NMOS transistor M33 is connected to a positive input terminal of a voltage comparator 335 in the current comparison circuit 330.

When the write enable signal PGMEN is at a high level and the write halting signal PGMSP are at a low level, the NMOS transistor M33 is turned on. Then, the data is written to the memory cell 310 while the NMOS transistor M33 is turned on. If the write halting signal PGMSP is changed from low to high, the NMOS transistor M33 is turned off. That is, data is not written to the memory cell 310 while the NMOS transistor M33 is turned off.

The current comparison circuit 330 has the voltage comparator 335 and resistors R1, R2, which respectively connect the positive and negative input terminals of the voltage comparator 335 to a terminal to which a drain voltage VDRAIN is applied, The positive input terminal of the comparator 335 also is connected to the drain electrode of the NMOS transistor M33, and the negative input terminal of the voltage comparator 335 is connected to the drain electrode of the NMOS transistor M32. Therefore, the comparator 335 receives a first voltage corresponding to the current across the NMOS transistor M31, through the resistor R1, and the second voltage corresponding to the current across the NMOS transistor M32, through the resistor R2.

The reference memory cell 340 includes the NMOS transistor M32. The NMOS transistor M332 has the control gate electrode connected the terminal to which the gate voltage VGATE is applied, the floating gate electrode connected to the terminal to which a floating gate voltage VFG is applied, the source electrode connected to ground, and the drain electrode connected to the negative input terminal of the comparator 335 of the current comparison circuit 330 and the resistor R2.

According to the third embodiment of the invention, the voltage comparator 335 compares the current across the memory cell 310 with the current across the reference memory cell 340. As a change in the current is detected as a voltage change across the resistors R1, R2, it is possible to detect a small difference between currents respectively across the memory cell 310 and the reference memory cell 340.

While the present invention has been described with reference to illustrative embodiments, this description is not intended to be construed in a limiting sense. In the embodiments, although the reference memory cell is used for generating the reference current, the reference current can be generated by the other well know method. Various modifications of the illustrated embodiments, as well as other embodiments of the invention, will be apparent to those skilled in the art on reference to this description. It is therefore contemplated that the appended claims will cover any such modifications or embodiments as falls within the true scope of the invention.

What I claim is:

1. A method for controlling a threshold voltage of a memory cell transistor having a floating gate, comprising the steps of:
    providing a first electric current to said memory cell transistor during a writing operation so that the floating gate of said memory cell transistor is charged;
    providing the first electric current to a reference cell transistor having a floating gate to which a reference voltage is applied, a second electric current determined by the reference voltage flowing through said reference cell transistor;
    comparing the first electric current with the second electric current; and
    halting the steps of providing the first electric current in response to a result of the comparison.

2. A method of controlling a threshold voltage as claimed in claim 1, wherein said comparing step includes producing a result signal when the second electric current exceeds the first electric current, and wherein said halting step is performed in response to the result signal.

3. A method of controlling a threshold voltage as claimed in claim 1, wherein a high level voltage, a low level voltage and a boosted level voltage that is greater than the high level voltage, are applied to a drain, a source and a control gate of the memory cell transistor, respectively during the writing operation.

4. A method of controlling a threshold voltage as claimed in claim 1, wherein a voltage at the floating gate of the memory cell transistor is substantially the same as the reference voltage when the flow of the first electric current is halted.

5. A method of controlling a threshold voltage as claimed in claim 1, wherein no electron is charged in the floating gate of the memory cell transistor before the first electric current is provided.

6. A semiconductor memory device, comprising:
    a memory cell transistor having a source, a drain, a floating gate and a control gate;
    a reference cell transistor having a source, a drain, a control gate and a floating gate to which a reference voltage is applied;
    a reference current generating circuit connected to provide a reference current to said memory cell transistor and said reference cell transistor, the reference current corresponding to a current across said memory cell transistor;
    a current comparison circuit connected to said reference cell transistor and said reference current generating circuit, said current comparison circuit comparing the reference current with a current across said reference cell transistor; and a control circuit connected to said memory cell transistor, said reference current generating circuit and said current comparison circuit, said control circuit halting the flow of the reference current to said memory cell transistor in response to a result of the comparison performed by said comparison circuit.

7. A semiconductor memory device as claimed in claim 6, wherein said reference current generating circuit includes a current mirror circuit.

8. A semiconductor memory device as claimed in claim 7, further comprising a first voltage source, the current mirror circuit being connected to said first voltage source and the drains of said memory cell transistor and said reference cell transistor.

9. A semiconductor memory device as claimed in claim 8, wherein the current mirror circuit includes a first PMOS transistor having a source connected to the first voltage source, a drain connected to the drain of said memory cell transistor and a gate connected to the drain thereof, and a second PMOS transistor having a source connected to the first voltage source, a drain connected to the drain of said reference cell transistor and a gate connected to the gate of the first PMOS transistor.

10. A semiconductor memory device as claimed in claim 7, further comprising a second voltage source, the current mirror circuit being connected to said second voltage source and the sources of said memory cell transistor and said reference cell transistor.

11. A semiconductor memory device as claimed in claim 6, wherein said control circuit disconnects the source of said memory cell transistor from a first voltage source in response to the result of the comparison.

12. A semiconductor memory device as claimed in claim 6, wherein said comparison circuit generates a comparison signal when the current across said reference cell transistor is greater than the reference current, and wherein said control circuit halts the flow of the reference current to said memory cell transistor in response to the comparison signal.

13. A semiconductor memory device, comprising:

a memory cell transistor having a source, a drain, a control gate and a floating gate;

a reference cell transistor having a source, a drain, a control gate and a floating gate to which a reference voltage is applied;

a first voltage providing circuit connected to apply a first voltage to the drains of said memory cell transistor and said reference cell transistor;

a comparator connected to the drains of said memory cell transistor and said reference cell transistor, said comparator generates a comparison signal when a voltage at the drain of the memory cell transistor is lower than that at the drain of the reference cell transistor; and a control circuit connected to said first voltage providing circuit and the drain of said memory cell transistor, said control circuit halting the application of the first voltage to the drain of said memory cell transistor in response to the comparison signal.

14. A semiconductor memory device as claimed in claim 13, wherein said first voltage providing circuit includes a first resistor connected between the drain of said memory cell transistor and the first voltage source and a second resistor connected between the drain of said reference cell transistor and the first voltage source.

15. A semiconductor memory device as claimed in claim 13, wherein said control circuit disconnects the source of said memory cell transistor from said first voltage providing circuit in response to the comparison signal.

16. A semiconductor memory device as claimed in claim 13, further comprising a second voltage source which is connected to the sources of said memory cell transistor and reference cell transistor.

* * * * *